(12) United States Patent
Matsukawa et al.

(10) Patent No.: US 8,288,458 B2
(45) Date of Patent: *Oct. 16, 2012

(54) COMPOSITION OF A FUNCTIONAL MATERIAL, AND METHOD OF AND APPARATUS FOR PRODUCING SAME

(75) Inventors: Kiyotaka Matsukawa, Osaka (JP); Kozo Ishihara, Osaka (JP); Kazuhiro Masano, Osaka (JP); Toshikazu Tanaka, Osaka (JP)

(73) Assignee: Nippon Kagaku Yakin Co., Ltd., Osaka (JP)

( * ) Notice: Subject to any disclaimer, the term of this patent is extended or adjusted under 35 U.S.C. 154(b) by 901 days.

This patent is subject to a terminal disclaimer.

(21) Appl. No.: 11/547,357

(22) PCT Filed: Mar. 28, 2005

(86) PCT No.: PCT/JP2005/005694
§ 371 (c)(1),
(2), (4) Date: Dec. 26, 2006

(87) PCT Pub. No.: WO2005/096325
PCT Pub. Date: Oct. 13, 2005

(65) Prior Publication Data
US 2008/0035879 A1 Feb. 14, 2008

(30) Foreign Application Priority Data

Mar. 31, 2004 (JP) .................. 2004-105312

(51) Int. Cl.
C08K 3/38 (2006.01)
C08K 3/34 (2006.01)
C08G 69/26 (2006.01)
C09C 1/22 (2006.01)
B32B 27/34 (2006.01)
B32B 15/08 (2006.01)
H01F 1/26 (2006.01)
H01F 1/147 (2006.01)

(52) U.S. Cl. ........ 523/500; 524/493; 524/606; 524/701; 106/460; 428/403; 428/407; 428/692.1; 252/62.54; 252/62.55

(58) Field of Classification Search .............. 428/403, 428/407, 692.1; 252/62.54, 62.55; 523/500; 524/493, 606, 701; 106/460
See application file for complete search history.

(56) References Cited

U.S. PATENT DOCUMENTS 6,063,303 A 5/2000 Ohtaki
(Continued)

FOREIGN PATENT DOCUMENTS

EP 0 921 534 6/1999
(Continued)

OTHER PUBLICATIONS

Korean Office Action (with English translation) issued Mar. 6, 2012 in corresponding Korean Application No. 10-2006-7022808.

Primary Examiner — Michael Pepitone
(74) Attorney, Agent, or Firm — Wenderoth, Lind & Ponack, L.L.P.

(57) ABSTRACT

An aggregate of functional particles includes a plurality of functional particles and an insulating material for covering the plurality of functional particles, and a large number of aggregates of functional particles are filled in a resin. Alternatively, insulating functional particles are added to the plurality of functional particles by an amount less than 50% of that of the functional particles in volume ratio.

4 Claims, 4 Drawing Sheets

U.S. PATENT DOCUMENTS

| | | | |
|---|---|---|---|
| 6,368,423 B1 * | 4/2002 | Otsuka et al. | 148/104 |
| 7,390,567 B2 * | 6/2008 | Matsukawa et al. | 428/403 |
| 2003/0127157 A1 * | 7/2003 | Iyoda et al. | 148/104 |
| 2004/0238796 A1 * | 12/2004 | Abe | 252/500 |

FOREIGN PATENT DOCUMENTS

| | | |
|---|---|---|
| JP | 2-198106 | 8/1990 |
| JP | 5-129119 | 5/1993 |
| JP | 11-31612 | 2/1999 |
| JP | 2000-77221 | 3/2000 |
| JP | 2002-75785 | 3/2002 |
| JP | 2002-105502 | 4/2002 |
| JP | 2003-62444 | 3/2003 |
| JP | 2003-183702 | 7/2003 |
| WO | 98/08233 | 2/1998 |
| WO | WO 2005015581 A1 * | 2/2005 |

* cited by examiner

DIRECTION OF ROTATION

COMPOSITION OF A FUNCTIONAL MATERIAL, AND METHOD OF AND APPARATUS FOR PRODUCING SAME

TECHNICAL FIELD

The present invention relates to a composition of a functional material that includes functional particles having characteristic properties such as soft magnetic properties, electromagnetic wave absorptivity, thermal conductivity or the like, the functional particles being covered with an insulating material. The present invention also relates to production of such a composition.

BACKGROUND ART

Soft ferrite is one of functional materials and has a property of being light and high in electric resistance, and a soft magnetic resin composition, in which powder of soft ferrite is dispersed in a synthetic resin, is employed in transformers, choke coils, inductors and the like.

Such a soft magnetic resin composition can be advantageously used in making a compact having a high electric resistance, but the saturation magnetic flux density thereof is not high and, hence, it is not a good enough composition for use in a compact that is required to have a high saturation magnetic flux density.

On the other hand, metal-based soft magnetic materials have a drawback of being low in electric resistance, though they have a high saturation magnetic flux density.

In view of the above, Patent document 1 has been proposed which discloses a soft magnetic resin composition containing a synthetic resin and a soft magnetic material, in which a combination of powder of an oxide-based magnetic material such as, for example, Ni—Zn-based ferrite or Mg—Zn-based ferrite and powder of a metal-based magnetic material having an electric insulating surface layer is used as a soft magnetic material, resulting in a soft magnetic resin composition having a high permeability, a withstand voltage, and a high saturation magnetic flux density.

Patent document 1: Japanese Laid-Open Patent Publication No. 11-31612 (page 2)

DISCLOSURE OF THE INVENTION

Problems to be Solved by the Invention

Conventional compositions including a composition of a functional material as disclosed in Patent document 1 are first formed into functional particles upon granulation or pelletization, sintering, and crushing. The functional particles are then mixed with a resin and formed into a compact of a desired shape by injection molding, extrusion molding, compression molding or the like. Such functional particles can be advantageously made with a simple process, but on the other hand, they cannot be used in applications where electric conductivity that may be caused by contact of particles is inconvenient. Further, if the amount of fill of the functional particles in the compact is reduced, the function itself is also lowered, though contact of the particles can be reduced.

In view of the above, various insulating methods have been proposed for the purpose of providing the surface of each particle with insulating properties. Those methods have the advantage of increasing the insulating properties even if the amount of fill of the functional particles is increased, but they cannot always offer a particle size suited for injection molding or the like and involve the following problems.

| Conventional Particle Insulating Method | Problems |
| --- | --- |
| Resin Coating | As the size of powder particles reduces or the particle shape varies, the amount of resin required for insulation increases and, hence, the amount of fill of the powder cannot be increased. |
| Plating | Because the kind of insulating plating is limited, it lacks flexibility. |
| Oxide Coating (heat) | As the size of powder particles reduces or the particle shape varies, portions that are oxidized increase, resulting in a reduction in function. |
| CVD, PVD, etc. | A relatively long period of time is required for obtaining a film thickness sufficient for insulation, resulting in an increase in cost. |
| Mechanical Coating such as Mechanical Alloying, Mechano Fusion, etc. | The mechanical alloying is low in productivity. Where a resin is used as a coating material, it encounters the same problems as those of the resin coating. |

The present invention has been developed to overcome the above-described disadvantages, and it is accordingly an objective of the present invention to provide a composition of a functional material and a method of and an apparatus for producing the same that can increase the amount of fill of a powdery material even if the powder is fine or has a varying shape. The composition of the functional material according to the present invention is superior in compactibility or moldability, has a great deal of flexibility, and is balanced between the insulation performance and the functioning.

Means to Solve the Problems

In accomplishing the above objective, the present invention provides a functional resin material characterized in that a large number of aggregates of functional particles are filled in a resin, each of the large number of aggregates of functional particles including a plurality of functional particles and an insulating material for covering the plurality of functional particles.

It is preferred that insulating functional particles be added to the plurality of functional particles by an amount less than 50% of that of the functional particles in volume ratio. The insulating functional particles may be oxides of the functional particles.

It is also preferred that the plurality of functional particles have a property superior in at least one of soft magnetic properties, electromagnetic wave absorptivity and thermal conductivity.

The present invention also provides a method of producing a compact that includes preparing pellets using the functional resin material referred to above, and obtaining a compact by injection molding the pellets.

The present invention further provides a method of producing aggregates of functional particles that include mixing functional particles and a binder for binding the functional particles to provide mixed powder, and calcining the mixed powder in an oxidizing atmosphere, thereby providing aggregates of functional particles with each aggregate covered with an oxide film.

In this case, it is preferred that the volume ratio of the binder to the mixed powder be in the range of 0.5%-10%, and that prior to calcining the mixed powder in the oxidizing atmosphere, excess moisture adsorbed by the mixed powder be removed by reducing pressure.

During calcining, the aggregates of functional particles are preferably crushed by crushing balls each made of a metal ball covered with an insulating material.

The present invention also provides an apparatus for producing aggregates of functional particles, each aggregate including a plurality of functional particles covered with an insulating material. The apparatus includes a mixing container having an inlet opening defined therein, through which the functional particles and a binder for binding the functional particles are introduced into the mixing container, a drive means for rotating the mixing container, a gas supply means for supplying an oxidizing gas to the mixing container, a heating means for heating the oxidizing gas supplied from the gas supply means, and a pressure reducing means for reducing a pressure inside the mixing container. Upon introduction of the functional particles and the binder into the mixing container through the inlet opening, the pressure inside the mixing container is reduced by the pressure reducing means, the oxidizing gas is supplied to the mixing container from the gas supply means while the mixing container is rotated by the drive means, and the oxidizing gas is heated by the heating means, thereby providing the aggregates of functional particles, in each of which the plurality of functional particles are covered with an oxide film.

Preferably, the mixing container has a central portion of a diameter greater than that of opposite ends thereof and a plurality of protruding powder guides formed on an inner surface thereof so as to be inclined with respect to a longitudinal axis of the mixing container.

The present invention further provides a method of producing different aggregates of functional particles, which includes mixing functional particles and an insulating material having a softening temperature greater than an injection molding temperature to provide a mixture, and granulating the mixture to prepare aggregates of functional particles, in each of which a plurality of functional particles are covered with the insulating material, a volume ratio of the insulating material being set to 5%-30% of the aggregates of functional particles.

In this case, it is preferred that the mixture be granulated under vacuum.

Effects of the Invention

According to the present invention, a large number of aggregates of functional particles each including a plurality of functional particles covered with an insulating material are filled in a resin, and as the occasion demands, insulating functional particles are added to the plurality of functional particles. Because of this, even if fine powder or powder of a varying shape is used, the amount of fill of the powder can be increased, and a functional resin material according to the present invention is superior in compactibility or moldability. Also, such a functional resin material has a great deal of flexibility and is balanced between the insulation performance and the functioning.

| Explanation of Reference Numerals | |
|---|---|
| 2 | functional particle |
| 4 | insulating material |
| 5 | insulating functional particle |
| 6 | mixing container |
| 8 | gas supply means |
| 10 | heating means |
| 12 | pressure reducing means |
| 14 | exhaust means |
| 16 | roller |
| 18 | inlet opening |
| 20, 22, 24 | valve |
| 26 | powder guide |
| 28 | resin |
| A | aggregate of functional particles |

BEST MODE FOR CARRYING OUT THE INVENTION

An embodiment of the present invention is explained hereinafter with reference to the drawings.

Figure 1:
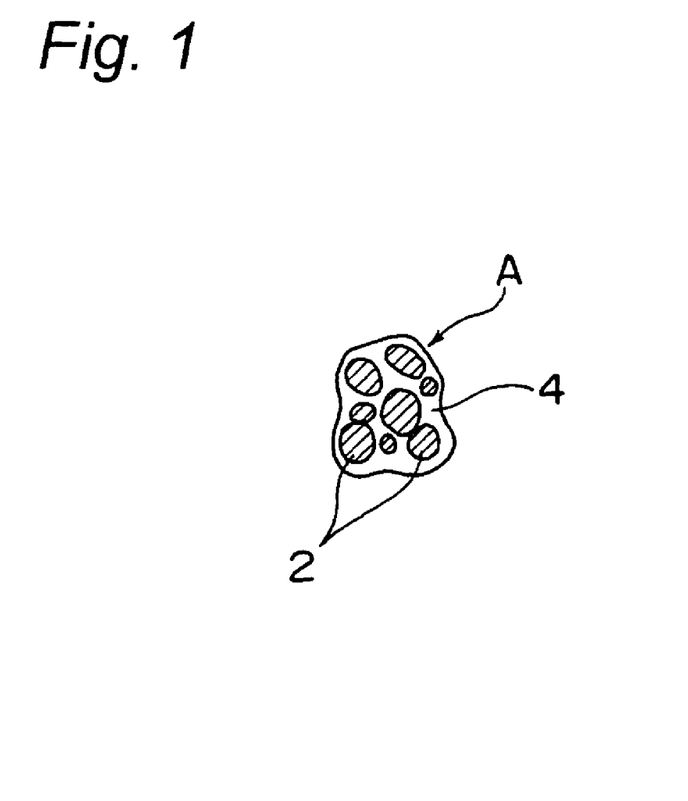
FIG. 1 is a sectional view of an aggregate of functional particles according to the present invention.

FIG. 1 depicts a composition of a functional material according to the present invention, which is pelletized or granulated into an aggregate A of functional particles that is made of a plurality of functional particles 2 having a property superior in at least one of soft magnetic properties, electromagnetic wave absorptivity and thermal conductivity, and an insulating material 4 for covering such functional particles 2.

A conventional composition of a functional material contains functional particles that are each covered with an insulating material, while the composition of the functional material according to the present invention constitutes an aggregate A of functional particles in which a plurality of functional particles 2 are covered with the insulating material 4 as a whole and, hence, each functional particle 2 in the aggregate A is not always covered with the insulating material 4, and there is a possibility that a certain functional particle 2 may be held in contact with an adjacent one of the functional particles 2.

Figure 2:
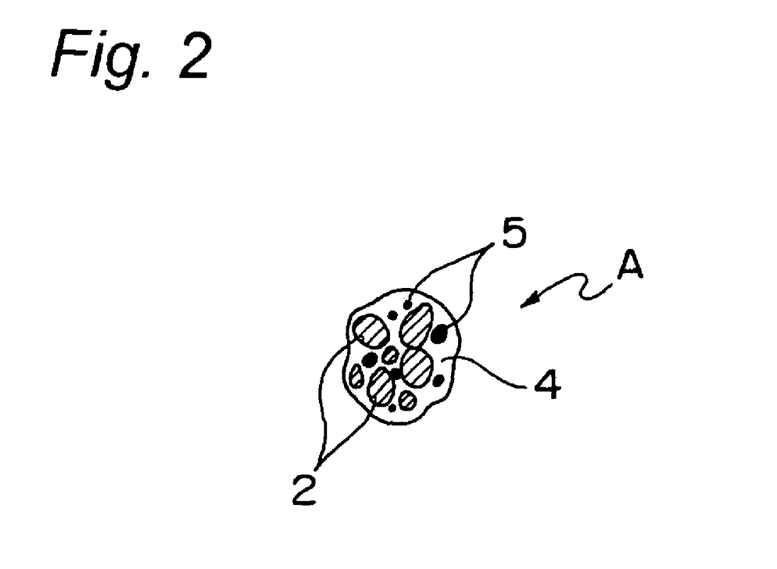
FIG. 2 is a sectional view of another aggregate of functional particles according to the present invention.

As shown in FIG. 2, adjacent functional particles can be insulated to some extent by causing a plurality of insulating functional particles 5 to be dotted between the plurality of functional particles 2, thereby enhancing the insulating properties.

A material that is superior in soft magnetic properties, electromagnetic wave absorptivity, thermal conductivity or the like is selected for the functional particles 2, and the use of, for example, the following materials is preferred.

(1) Soft Magnetic Materials

Pure iron-based soft magnetic materials such as metal powder, iron nitride powder, etc.

Iron-containing alloy-based soft magnetic materials such as Fe—Si—Al alloy (sendust) powder, super sendust powder, Ni—Fe alloy (permalloy) powder, Co—Fe alloy powder, pure iron-based soft magnetic materials, Fe—Si—B-based alloy powder, etc.

Ferrite-based materials.

(2) Electromagnetic Wave Absorption Materials

Carbon-based filler carbon black, graphite, carbon fibers, and mixtures thereof.

Ferrite-based materials.

(3) Thermally Conductive Materials

Cu, Ni, Al, Cr, and alloy powder thereof.

Ceramic powder such as AlN, BN, $Si_3N_4$, SiC, $Al_2O_3$, BeO, etc.

(4) Synthetic Resins

Polyolefin such as polyethylene, polypropylene, an ethylene-vinyl acetate copolymer, ionomer, etc.

Polyamide such as nylon 6, nylon 66, nylon 6/66, nylon 46, nylon 12, etc.

Polyarylene sulfide such as polyphenylene sulfide, polyphenylene sulfide ketone, polyphenylene sulfide sulfone, etc.

Polyester such as polyethylene terephthalate, polybutylene terephthalate, all-aromatic polyester, etc.

Polyimide resin such as polyimide, polyetherimide, polyamideimide, etc.

Polystyrene resin such as polystyrene, an acrylonitrile-styrene copolymer, etc.

Chlorine-containing vinyl resin such as polyvinyl chloride, polyvinylidene chloride, a vinyl chloride-vinylidene chloride copolymer, chlorinated polyethylene, etc.

Poly(meth)acrylate ester such as polymethyl acrylate, polymethyl methacrylate, etc.

Acrylonitrile resin such as polyacrylonitrile, polymethacrylonitrile, etc.

Fluororesin such as a tetrafluoroethylene/perfluoroalkyl vinyl ether copolymer, polytetrafluoroethylene, a tetrafluoroethylene/hexafluoropropylene copolymer, polyvinylidene fluoride, etc.

Various engineering plastic materials such as silicone resin, for example, polydimethylsiloxane, polyphenylene oxide, polyether ether ketone, polyether ketone, polyarylate, polysulfone, polyether sulfone, etc.

Various thermoplastic resins such as polyacetal, polycarbonate, polyvinyl acetate, polyvinyl formal, polyvinyl butyral, polybutylene, polyisobutylene, polymethylpentene, a butadiene resin, polyethylene oxide, oxybenzoyl polyester, polyparaxylene, etc.

Thermosetting resins such as an epoxy resin, a phenol resin, an unsaturated polyester resin, etc.

Mixtures of at least two mentioned above.

Figure 3:
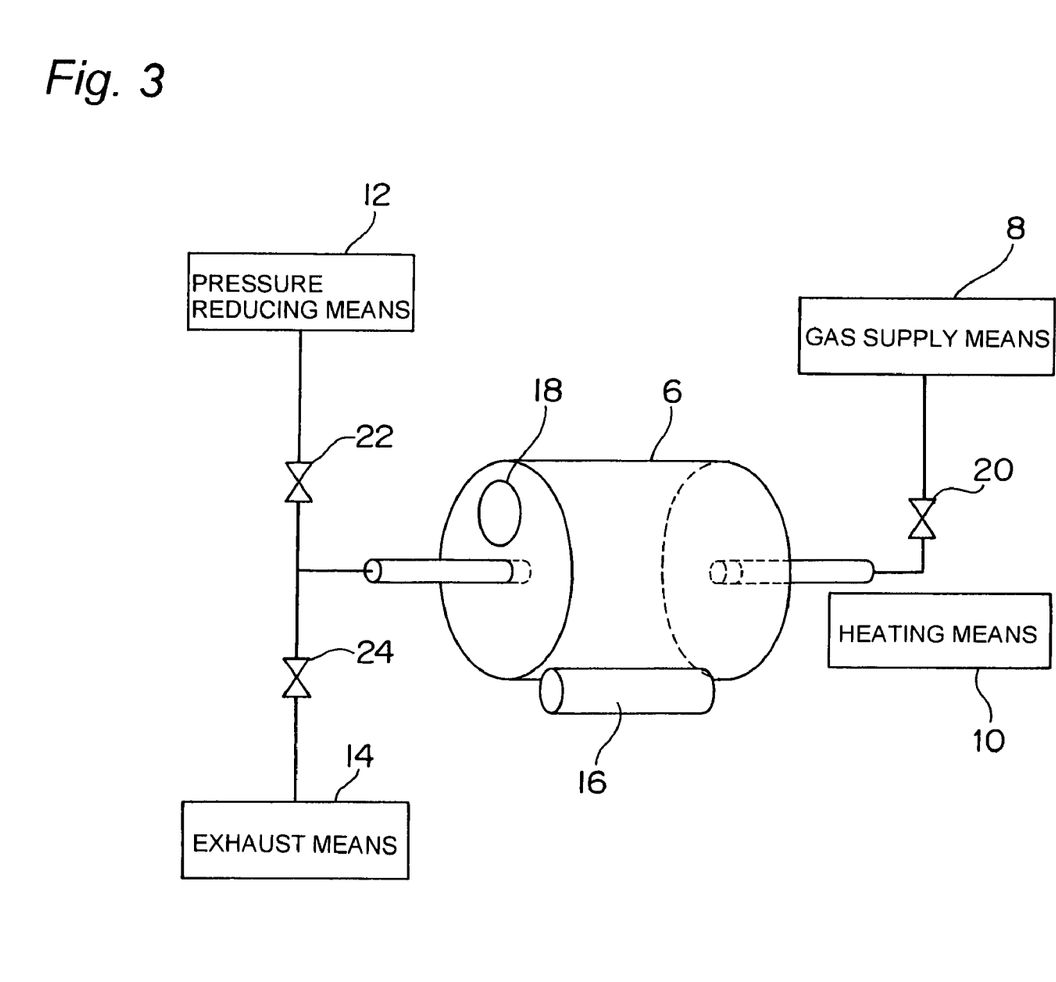
FIG. 3 is a schematic view of an apparatus for producing the aggregate of functional particles according to the present invention.

FIG. 3 depicts an apparatus for producing an aggregate A of functional particles according to the present invention. This apparatus is used to form an oxide film as an insulating material around the functional particles 2 by oxidizing the functional particles 2. The apparatus includes a generally cylindrical mixing container 6, a gas supply means 8 and a heating means 10 both connected to one end of the mixing container 6, and a pressure reducing means (for example, a vacuum pump) 12 and an exhaust means 14 both connected to the other end of the mixing container 6. A peripheral surface of the mixing container 6 is held in contact with a roller 16, which is driven by a drive means (not shown) to rotate the mixing container 6. The mixing container 6 has an inlet opening 18 defined in one end surface thereof, through which the functional particles 2 are introduced.

In FIG. 3, reference numerals 20, 22, 24 denote valves.

A method of producing the aggregate A of functional particles shown in FIG. 1 with the use of the apparatus shown in FIG. 3 is explained hereinafter.

A large number of functional particles 2 together with a binder such as, for example, PVA (polyvinyl alcohol) are first introduced into the mixing container 6 through the inlet opening 18, and the valve 22 is then opened so that the pressure reducing means 12 can evacuate the mixing container 6 until the inside of the mixing container 6 is reduced to a predetermined pressure (for example, 1 Torr=133 Pa). By so doing, excess moisture adsorbed by the functional particles 2 or the binder is removed. Thereafter, the pressure reducing means 12 is stopped and the valve 22 is closed. The roller 16 is then driven by the drive means to rotate the mixing container 6 and, at the same time, the valves 20, 24 are opened so that an oxidizing gas (for example, air, a gaseous mixture of oxygen and an inert gas, or the like) may be supplied to the mixing container 6 from the gas supply means 8 and heated by the heating means 10, while gasses contained within the mixing container 6 are exhausted by the exhaust means 14.

Although a great deal of moisture is contained in the functional particles 2 or the binder, the amount thereof varies depending on seasons or some other factors. Because the degree of oxidation has an influence on the characteristics of the aggregate A of functional particles, the pressure reducing means 12 is provided to remove moisture in advance.

The above processes provide a mixture of the functional particles 2 and the binder, which is then calcined in an oxidizing atmosphere, thereby providing a large number of integrated aggregates A of functional particles having a predetermined size with each aggregate A covered with an oxide film. In such aggregates A of functional particles, the oxide film acts as an insulating material 4. The aggregates A of functional particles are filled in a resin and formed into a compact of a desired shape by injection molding, extrusion molding, compression molding or the like in the manner explained below. If the aggregates A of functional particles have a size greater than the size suited for the molding, it is preferred that crushing balls, each made of a metal ball covered with an insulating material, together with the functional particles 2 be introduced into the mixing container 6. During formation of the aggregates A of functional particles, the crushing balls act to crush them into a size suited for the molding.

When the aggregates A of functional particles shown in FIG. 2 are produced, a large number of insulating functional particles 5 together with a large number of functional particles 2 and a binder are introduced into the mixing container 6. In order to ensure a predetermined function, it is preferred that the amount of introduction of the insulating functional particles 5 be less than 50% of that of the functional particles 2 in volume ratio. The insulating functional particles 5 may be oxides of the functional particles 2.

It is also preferred that the amount of the binder be in the range of 0.5%-10% of the mixture of the functional particles 2 and the binder in volume ratio. If the amount of the binder is less than 0.5%, pelletization or granulation is impossible. On the other hand, if the amount of the binder exceeds 10%, the amount of residual binder increases, and the degree of cohesion between particles depending on oxidation becomes weak.

It is to be noted here that the apparatus shown in FIG. 3 is an apparatus where an oxide film is used as the insulating material 4. An apparatus employing no oxidation process does not need the gas supply means 8 and the exhaust means 14. In this case, functional particles 2 and an insulating material are introduced into the mixing container 6 through the inlet opening 18, and when aggregates A of functional particles obtained upon mixing and granulation are formed into a desired shape by, for example, injection molding, a thermoplastic resin or thermosetting resin having a softening temperature greater than an injection molding temperature is used as the insulting material.

The volume ratio of the insulating material is set to 5%-30% of the aggregates of functional particles. If the amount of the insulating material is less than 5%, the strength or insulation performance of the granulated objects is insufficient. On the other hand, if the amount of the insulating material exceeds 30%, the characteristics of a mold 損ied resin object are lowered.

Further, if mixing and granulation are carried out under vacuum, it is possible to prevent bubbles from entering the aggregates A of functional particles.

Although in the apparatus shown in FIG. 3 the mixing container 6 has been described as being rotated by the roller 16, the mixing container 6 may be provided with a driven gear that is held in mesh with a drive gear mounted on the drive means for rotation of the mixing container 6. Also, although the mixing container 6 has been described as having one inlet opening 18, it may have two inlet openings, through which the functional particles 2 and the insulating material can be separately introduced into the mixing container 6. Further, although the heating means 10 is provided to heat a gas supplied from the gas supply means 8, the heating means 10 may be positioned in close proximity to the mixing container 6 for direct heating of the mixing container 6. In addition, a three-way cock can be used to switch the pressure reducing means 12 and the exhaust means 14 or switch the gas supply means 8 and the pressure reducing means 12.

Figure 4A:
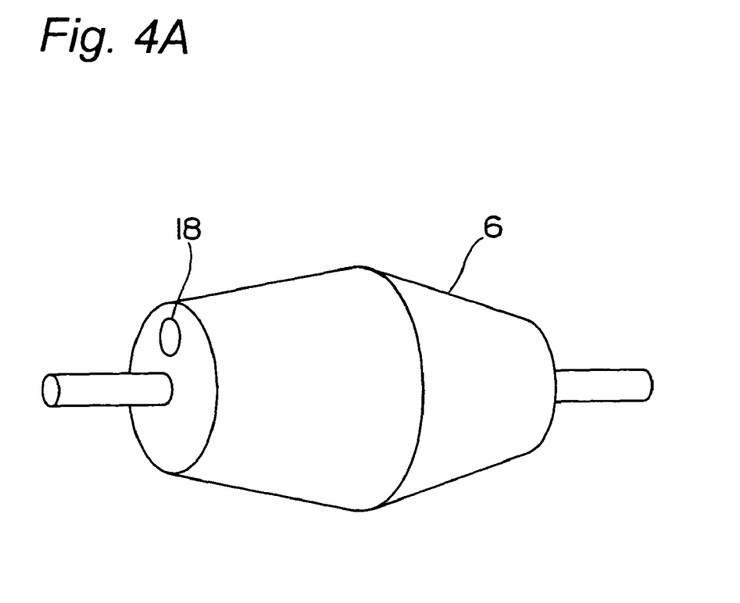
FIG. 4A is a perspective view of a modification of a mixing container mounted in the apparatus of FIG. 3.
Figure 4B:
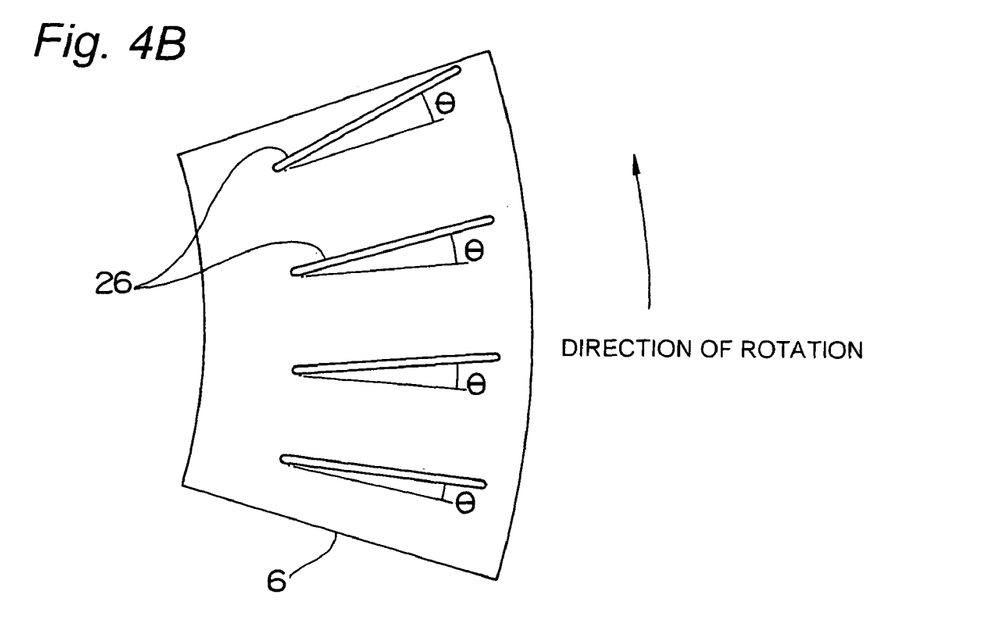
FIG. 4B is an expanded view of an inner surface of one of side walls when the mixing container of FIG. 4A is divided into two in a direction perpendicular to a longitudinal axis thereof.

FIG. 4A depicts a perspective view of a modification of the mixing container 6, and FIG. 4B depicts an inner surface of one of side walls when the mixing container 6 shown in FIG. 4A is divided into two in a direction perpendicular to a longitudinal axis thereof.

The mixing container 6 shown in FIG. 4A has a central portion having a diameter greater than that of opposite ends thereof. When this mixing container 6 is divided into two in the direction perpendicular to the longitudinal axis thereof, each of them presents the shape of a truncated cone. Upon introduction of raw materials such as functional particles and the like into the mixing container 6, when the mixing container 6 is rotated for granulation of the raw materials, the raw materials tend to be collected towards the large-diameter central portion. In order to prevent such a tendency, the mixing container 6 has a plurality of inwardly protruding powder guides 26 formed at regular intervals on the inner surface of each of the side walls thereof, as shown in FIG. 4B. The plurality of powder guides 26 are inclined a predetermined angle θ with respect to the longitudinal axis of the mixing container 6.

When the raw materials such as the functional particles and the like are introduced into the mixing container 6, the raw materials tend to be collected towards the large-diameter central portion, but the inclined powder guides 26 act to disperse the raw materials almost uniformly towards the opposite ends of the mixing container 6 with rotation of the mixing container 6, resulting in predetermined granulation.

Figure 5:
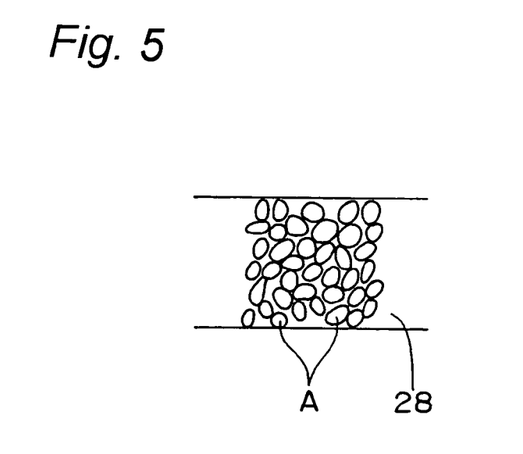
FIG. 5 is a sectional view of a functional resin material according to the present invention.
Figure 6:
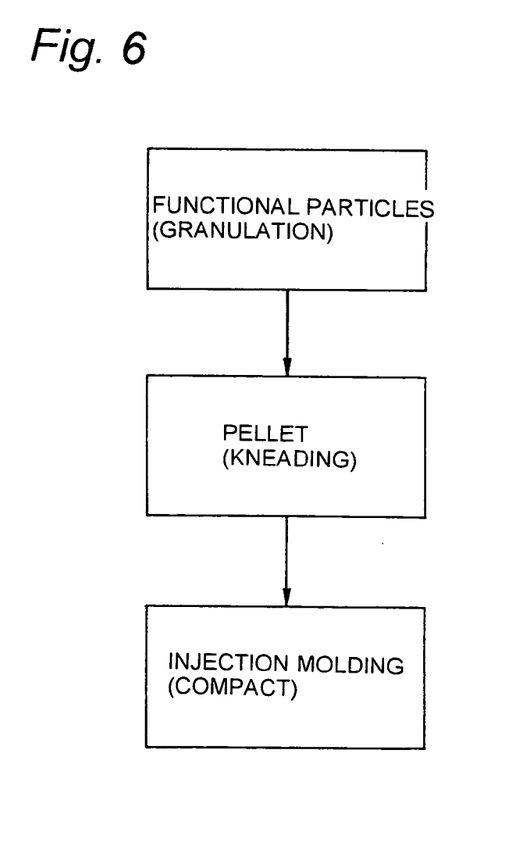
FIG. 6 is a block diagram depicting a case where a compact is formed using the functional resin material of FIG. 5.

FIG. 5 depicts a functional resin material according to the present invention, in which a large number of granulated aggregates A of functional particles are filled in a resin 28. As shown in FIG. 6, this functional resin material is used as a resin material for injection molding or the like.

More specifically, the aggregates A of functional particles as shown in FIG. 1 or 2 are first prepared using the apparatus shown in FIG. 3, and the aggregates A of functional particles and the resin 28 are then kneaded to prepare pellets, which are in turn formed into a compact of a desired shape by injection molding.

Fillers such as, for example, glass fibers or carbon fibers may be added to the resin 28 to increase the strength of the compact. If carbon fiber fillers are added to a resin 28 containing a thermally conductive material, the electromagnetic wave absorptivity as well as the thermal conductivity is enhanced.

EXAMPLES

A large number of samples having the following shape were prepared using a functional resin material, in which the aggregates of functional particles according to the present invention were filled, for investigation of the direct current bias characteristics that are alternating current magnetic properties suited for evaluation of the insulation performance.

Shape of Samples
Inner diameter: 12.6 mm
Outer diameter: 20.2 mm
Height: 6.3 mm (1) The direct current bias characteristics of the samples were investigated by selecting amorphous powder and ferrite powder as the functional particles and the insulating functional particles, respectively, by selecting epoxy resin powder as the insulating material for the functional particles, and by selecting nylon 6 as the resin in which the aggregates of functional particles were filled. The amount of the functional particles filled (the volume ratio of the functional particles to the aggregates of functional particles) was set to 90%, and the final amount of the functional particles (the volume ratio of the functional particles contained in the final samples) was set to 60%. Measuring equipment, a DC bias current, and other conditions were as follows.

Measuring Equipment
HP-4284A made by Hewlett-Packard Company
HP-42841A made by Hewlett-Packard Company
(Two devises were used as one set)
Frequency: 10 kHz
DC bias current: 10 A
Temperature of measuring room: 23° C.
Humidity of measuring room: 50%
Amorphous powder
Powder composition: $(Fe_{0.97}Cr_{0.03})_{76}(SiO_{0.5}B_{0.2})_{22}C_2$
Average particle diameter: 20 μm
Ferrite powder
Powder composition: $(MnZn)O.Fe_2O_3$
Average particle diameter: 5 μm
Average particle diameter of aggregates of functional particles: 100 μm Table 1 shows the direct current bias characteristics.

TABLE 1

| Amorphous powder (vol %) | Ferrite powder (vol %) | DC bias characteristics (%) |
|---|---|---|
| 100 | 0 | 96 |
| 98 | 2 | 96 |
| 95 | 5 | 95 |
| 90 | 10 | 95 |
| 80 | 20 | 94 |
| 60 | 40 | 93 |
| 50 | 50 | 91 |
| 40 | 60 | 85 |

The values of the DC bias current are values (%) when the inductance value was 100% at 0 A, and the number of turns of a copper wire wound around the samples was selected so that the inductance value at 0 A might be closest to 10 μH.

In table 1, if the current values over 90% are regarded as being acceptable in terms of the direct current bias characteristics, it is sufficient if ferrite powder (insulating functional particles) is added less than 50% in volume ratio.

(2) The conventional functional particles and the aggregates of functional particles according to the present invention were compared by investigating their direct current bias characteristics. Amorphous powder particles were used for the conventional functional particles, while the same aggregates as those referred to above (1) were used as the aggregates of functional particles according to the present invention, and the amount of the functional particles was set to 90%.

Table 2 shows the direct current bias characteristics.

TABLE 2

| Final amount (vol %) | DC bias characteristics (%) | |
|---|---|---|
| | Conventional functional particles: only amorphous powder (vol %) | Aggregates of functional particles (vol %) |
| 50 | 100 | 98 |
| 60 | 90 | 96 |
| 65 | 83 | 96 |
| 70 | 40 | 90 |
| 72 | 5 | 88 |

Table 2 reveals that the aggregates of functional particles according to the present invention are superior to the conventional functional particles in terms of the direct current bias characteristics.

(3) In the aggregates of functional particles according to the present invention, the influence of the amount of the insulating material upon the direct current bias characteristics was investigated.

Tables 3 and 4 show the direct current bias characteristics when the final amount was set to 50% and 60%, respectively.

TABLE 3

| Insulating material (vol %) | DC bias characteristics (%) |
|---|---|
| 1 | 30 |
| 3 | 91 |
| 5 | 92 |
| 10 | 97 |
| 15 | 98 |
| 25 | 97 |
| 30 | 98 |
| 35 | 97 |

TABLE 4

| Insulating material (vol %) | DC bias characteristics (%) |
|---|---|
| 1 | 5 |
| 3 | 37 |
| 5 | 90 |
| 10 | 90 |
| 15 | 91 |
| 25 | 91 |
| 30 | 92 |
| 35 | Molding impossible |

Tables 3 and 4 reveal that the appropriate volume ratio of the insulating material to the aggregates of functional particles is in the range of 5%-30%.

Where the amount of the insulating material was 1 vol %, practically no granulation occurred.

(4) The aggregates of functional particles according to the present invention used in the measurements (1) to (3) referred to above were prepared using a process other than the oxidation process, while in this measurement the apparatus (oxidation process) shown in FIG. 4A was used to prepare the aggregates of functional particles. The influence of the amount of the binder (PVA) upon the direct current bias characteristics was investigated. Nylon 6 was selected as a resin in which the aggregates of functional particles were filled, and the final amount was set to 60%. The specification of the apparatus was as follows.

Gas heating temperature: 450° C.
Oxidizing gas: air (flow: 5 liters/min.)
Mixing container
Large-diameter portion (central portion): 100 mm
Length: 150 mm
Rotating speed: 60 rpm
Heat treatment time: 20 minutes
Vacuum: 1 Torr=133 Pa (one minute)
Amorphous powder
Powder composition: $(Fe_{0.97}Cr_{0.03})_{76}(SiO_{0.5}B_{0.2})_{22}C_2$
Average particle diameter: 150 μm
Table 5 shows the direct current bias characteristics.

TABLE 5

| Binder (vol %) | DC bias characteristics (%) |
|---|---|
| 0.1 | No granulation |
| 0.3 | 84 |
| 0.5 | 91 |
| 1 | 91 |
| 5 | 92 |
| 10 | 94 |
| 15 | 95 |

In Table 5, in the case where the amount of the binder was 15 vol %, the number of turns of a copper wire wound around the samples and selected so that the inductance value at 0 A might be closest to 10 μH was much greater than the cases where the amount of the binder was less than 10 vol % and, hence, the appropriate volume ratio of the binder to the mixed powder is in the range of 0.5%-10%.

INDUSTRIAL APPLICABILITY

The aggregates of functional particles according to the present invention can increase the volume ratio of the powder thereto even if the powder is fine or has a varying shape and, at the same time, they are superior in compactibility or moldability. In addition, they have a great deal of flexibility and are balanced between the insulation performance and the functioning. Accordingly, they are useful to products that require superior soft magnetic properties, electromagnetic wave absorptivity, or thermal conductivity.

The invention claimed is:

1. A functional resin material for use in injection molding, the functional resin material comprising a resin and a plurality of aggregates of functional particles, each of the aggregates of functional particles comprising a plurality of functional particles and an insulating material covering the plurality of functional particles, wherein the resin is nylon 6, and wherein the aggregates of functional particles comprise (1) an amorphous magnetically soft alloy powder of $(Fe_{0.97}Cr_{0.03})_{76}(Si_{0.5}B_{0.2})_{22}C_2$ having an average particle diameter of 20 μm and a ferrite powder having an average particle diameter of 5 μm as the functional particles, and an epoxy resin powder as the insulating material, or (2) an amorphous magnetically soft alloy powder of $(Fe_{0.97}Cr_{0.03})_{76}(Si_{0.5}B_{0.2})_{22}C_2$ having an average particle diameter of 150 μm as the functional particles, and an oxide film as the insulating material.

2. The functional resin material according to claim 1, further comprising insulating functional particles added to the plurality of functional particles by an amount less than 50% of that of the functional particles in volume ratio.

3. The functional resin material according to claim 1, wherein of the plurality of functional particles covered with the insulating material, a functional particle is held in contact with an adjacent one of the functional particles.

4. A method of producing a compact, comprising:

preparing pellets using a functional resin material comprising a resin and a plurality of aggregates of functional particles, each of the aggregates of functional particles comprising a plurality of functional particles and an insulating material for covering the plurality of functional particles; and obtaining a compact by injection molding the pellets, wherein the resin is nylon 6, and wherein the aggregates of functional particles comprise (1) an amorphous magnetically soft alloy powder of $(Fe_{0.97}Cr_{0.03})_{76}(Si_{0.5}B_{0.2})_{22}C_2$ having an average particle diameter of 20 μm and a ferrite powder having an average particle diameter of 5 μm as the functional particles, and an epoxy resin powder as the insulating material, or (2) an amorphous magnetically soft alloy powder of $(Fe_{0.97}Cr_{0.03})_{76}(Si_{0.5}B_{0.2})_{22}C_2$ having an average particle diameter of 150 μm as the functional particles, and an oxide film as the insulating material.

* * * * *